(12) United States Patent
Sulzbacher et al.

(10) Patent No.: US 12,710,475 B2
(45) Date of Patent: Aug. 18, 2026

(54) SWITCHING DEVICE FOR A TEST BENCH FOR ELECTRICAL COMPONENTS AND TEST BENCH FOR ELECTRICAL COMPONENTS

(71) Applicant: HAHN Automation GmbH, Rheinböllen (DE)

(72) Inventors: Martin Sulzbacher, Dörrebach (DE); Andrej Justus, Simmern (DE); Thomas Meißner, Pfalzfeld (DE); Manuel Praetorius, Rheinböllen (DE)

(73) Assignee: HAHN AUTOMATION GMBH, Rheinböllen (DE)

(*) Notice: Subject to any disclaimer, the term of this patent is extended or adjusted under 35 U.S.C. 154(b) by 336 days.

(21) Appl. No.: 18/326,596

(22) Filed: May 31, 2023

(65) Prior Publication Data

US 2023/0384380 A1 Nov. 30, 2023

(30) Foreign Application Priority Data

May 31, 2022 (DE) ..................... 10 2022 113 770.8

(51) Int. Cl.
*G01R 31/36* (2020.01)
*H01H 63/06* (2006.01)
(Continued)

(52) U.S. Cl.
CPC ......... *G01R 31/3644* (2013.01); *H01H 63/06* (2013.01); *H01H 67/22* (2013.01); *H01M 10/4285* (2013.01); *H01H 2239/044* (2013.01)

(58) Field of Classification Search
CPC .... G01R 31/3644; H01H 63/06; H01H 67/22; H01H 2239/044; H01M 10/4285
(Continued)

(56) References Cited

U.S. PATENT DOCUMENTS

2013/0319127 A1* 12/2013 Vodnick ................. G01Q 40/00 73/788
2016/0293349 A1* 10/2016 Ostmeier ............. H01R 9/2666
(Continued)

FOREIGN PATENT DOCUMENTS

CN 111077352 A 4/2020
CN 212540654 U 2/2021
(Continued)

*Primary Examiner* — Giovanni Astacio-Oquendo
*Assistant Examiner* — Trung Q Nguyen
(74) *Attorney, Agent, or Firm* — CANTOR COLBURN LLP

(57) ABSTRACT

A switching device for a test stand for electrical components has a support structure and a first contact block attached thereto. The first contact block has first connections for connecting a battery to be tested; one or more second connections for connecting a high-voltage tester; and third connections for connecting a function tester. A second contact block that is a contact bridge and is movable relative to the first contact block is included. The second contact block, in a first contact position, connects first connections to at least one second connection. The first connections are bridged in the first contact position by a bridge element of the first contact block and connected to at least one second connection via the bridge element or, in a first contact position, connects first connections to second connections, wherein the second contact block, in a second contact position, connects first connections to third connections.

19 Claims, 10 Drawing Sheets

(51) Int. Cl.
*H01H 67/22* (2006.01)
*H01M 10/42* (2006.01)

(58) Field of Classification Search
USPC ...................... 324/500, 600, 76.11, 415–437
See application file for complete search history.

(56) References Cited

U.S. PATENT DOCUMENTS

| | | | | |
|---|---|---|---|---|
| 2019/0273289 | A1 | 9/2019 | Hahn et al. | |
| 2021/0141043 | A1* | 5/2021 | Bertness | H02J 7/005 |
| 2022/0018748 | A1* | 1/2022 | Zhao | G01N 3/068 |
| 2023/0266372 | A1* | 8/2023 | Kim | G01R 27/025 |
| 2023/0317392 | A1* | 10/2023 | Lee | H01H 33/16<br>335/196 |
| 2023/0384381 | A1* | 11/2023 | Meißner | G01R 31/364 |
| 2024/0145796 | A1* | 5/2024 | Ruan | G01R 31/364 |

FOREIGN PATENT DOCUMENTS

| | | | |
|---|---|---|---|
| CN | 112845151 | A | 5/2021 |
| CN | 113490355 | A | 10/2021 |
| CN | 217655232 | A | 10/2022 |

* cited by examiner

2 L 8 12 10
20
6
4
Z Y
X

SWITCHING DEVICE FOR A TEST BENCH FOR ELECTRICAL COMPONENTS AND TEST BENCH FOR ELECTRICAL COMPONENTS

CROSS-REFERENCE TO RELATED APPLICATIONS

This application claims the benefit of German patent application no. 10 2022 113 770.8, filed on 31 May 2022, the disclosure of which is incorporated herein by reference in its entirety.

TECHNICAL FIELD

The present disclosure relates to a switching device for a test stand for electrical components and a test stand for electrical components.

BACKGROUND

Modern motor vehicles are increasingly equipped with completely electric motor drive or hybrid drive. A battery, which is also designated as a traction battery, is used here to supply an electric motor or multiple electric motors with electric power to drive the relevant vehicle by means of the electric motor or by means of several electric motors.

During the production of such batteries, they are subjected to a variety of tests. Among other things, a power test or functional test of the battery takes place, which ensures the functionality and functional reliability within the context of an end-of-line test. The battery to be tested is charged and discharged multiple times in a short time here. Furthermore, the battery can be subjected to a high voltage for insulation testing.

A large number of plug connections are required to connect a battery to be tested to a test stand for electrical components. For example, in addition to the power supply, there may be a large number of control and data lines, all of which must be connected separately. Thus, it can happen that more than forty plug connections are made between the battery and the test stand for electrical components.

During a power or functional test of the battery, all connections of the battery are switched separately. During the high-voltage or insulation test, however, the connections must be bridged and then tested or wired individually again. It is therefore a challenge to be able to switch quickly between a power test and an insulation test.

The terms power test and functional test are used synonymously in this text.

During power testing, voltages in ranges from 5 volts up to 1000 volts and currents in ranges up to 1000 amps are applied. During insulation testing, voltages are applied in the range of up to 10000 volts with currents in the range of a few milliamperes. It is therefore a challenge to provide robust components that transmit the above electric power reliably and safely, especially in a compact design.

SUMMARY

Against this background, the disclosure is based on the technical problem of specifying a switching device for a test stand for electrical components and a test stand for electrical components, which enable a simple, safe and fast change between a functional test and an insulation test, reliably and safely transmit the electric power required in the process and, in particular, take up a small installation space.

The technical problem described above is solved in each case by the independent claims. Further embodiments of the disclosure result from the dependent claims and the following description.

According to a first alternative, the disclosure relates to a switching device for a test stand for electrical components, having a support structure, having a first contact block attached to the support structure, wherein the first contact block has first connections for connecting a battery to be tested, wherein the first contact block has one or more second connections for connecting a high-voltage tester, and wherein the first contact block has third connections for connecting a function tester, having a second contact block, wherein the second contact block is a contact bridge, wherein the second contact block is movable relative to the first contact block, wherein the second contact block, in a first contact position, connects the first connections to at least one second connection, wherein the first connections are bridged in the first contact position by means of a bridge element of the first contact block and are connected to the at least one second connection via the bridge element, wherein the second contact block, in a second contact position, connects the first connections to the third connections.

According to the above described first alternative design of the switching device according to the disclosure, the first connections are bridged in the first contact position.

According to a second alternative, the disclosure relates to a switching device for a test stand for electrical components, having a support structure, having a first contact block attached to the support structure, wherein the first contact block has first connections for connecting a battery to be tested, wherein the first contact block has one or more second connections for connecting a high-voltage tester, and wherein the first contact block has third connections for connecting a function tester, having a second contact block, wherein the second contact block is a contact bridge, wherein the second contact block is movable relative to the first contact block, wherein the second contact block, in a first contact position, connects the first connections to the second connections, wherein the second contact block, in a second contact position, connects the first connections to the third connections.

According to the above described second alternative design of the switching device according to the disclosure, the first connections are individually connected to the second connections in the first contact position.

According to the disclosure, two alternative switching devices are therefore indicated, wherein a first design of a first switching device according to the disclosure is configured in such a way that the second contact block, in a first contact position, connects the first connections to at least one second connection, wherein the first connections are bridged in the first contact position by means of a bridge element of the first contact block and are connected to the at least one second connection via the bridge element, and wherein a second design of a second switching device according to the disclosure is configured in such a way that the first connections are connected to the second connections in a first contact position.

The second contact block therefore makes it easy to switch quickly between a function test using a function tester and an insulation test using a high-voltage tester.

It may be provided that twenty or more first connections and twenty or more third connections are provided.

Alternatively or additionally, it may be provided that one hundred or fewer first connections and one hundred or fewer third connections are provided.

It may be provided that exactly forty first connections and exactly forty third connections are provided.

A high number of first and third connections can be used, for example, in the context of testing signal lines, such as BUS lines, CAN-BUS lines or the like.

According to one embodiment of the switching device, it may be provided that the first connections and the third connections are designed for a current of 32 amperes (A) or less and/or for a voltage of 10 kilovolts (kV) or less.

It may be provided that two or more first connections and two or more third connections are provided.

Alternatively or additionally, it may be provided that ten or fewer first connections and ten or fewer third connections are provided.

It may be provided that exactly three first connections and exactly three third connections are provided.

It may be provided that exactly six first connections and exactly six third connections are provided.

According to one embodiment of the switching device, it may be provided that the first connections and the third connections are designed for a current of at most 1000 amperes, in particular at most 600 amperes, and/or for a voltage of at most 10 kilovolts.

The first connections may be lined up side by side in a straight line along a longitudinal direction. The third connections may be lined up side by side in a straight line parallel to the first connections and at a distance from the first connections.

The bridge element may have an electrically conductive strip. The strip can be a copper strip or made of another electrically conductive metallic material.

According to one embodiment of the switching device, it may be provided that the strip is arranged at a distance from the first connections and the third connections and is extended parallel to the longitudinal direction and to the first and third connections which are lined up in a straight line.

Alternatively or additionally, it may be provided that the first connections are arranged between the strip and the third connections.

It may be provided that the first contact block has a connection side in the region of which the first connections can be connected to a wiring harness assigned to a battery to be tested and in the region of which the second connections can be connected to a function tester, and that the first contact block has a changeover side facing away from the connection side, in the region of which the first contact block can be connected to the second contact block.

According to one embodiment of the switching device, it may be provided that the first connections and the third connections form a first mating face and that connections of the second contact block form a second mating face matching the first mating face, so that the first connections and the third connections can be connected to each other simultaneously by means of the second contact block by moving the second contact block into the second contact position.

It may be provided that the number of first connections and the number of third connections are identical.

According to one embodiment of the switching device, it may be provided that connections of the second contact block have fourth connections and fifth connections whose number and arrangement correspond to the number and arrangement of the first connections and the third connections.

It may be provided that the first connections, the bridge element, and the third connections are arranged at the same height as viewed along a travel path of the second contact block.

According to one embodiment of the switching device, it may be provided that the second contact block can be moved automatically.

It may be provided that a first axis is assigned to the second contact block in order to displace the second contact block transversely of the first contact block, and that a second axis is assigned to the second contact block in order to remove the second contact block from the first contact block in order to make a mating connection in the direction of the first contact block and to release a mating connection from the first contact block.

According to a second aspect, the disclosure relates to a test stand for electrical components for testing a battery, having a high-voltage tester comprising a function tester, wherein the function tester comprises a source and/or sink for charging and/or discharging the battery and/or wherein the function tester comprises a data interface and/or a 12-volt supply for controlling the battery, having a switching device.

According to a third aspect, the disclosure relates to a test stand for electrical components for testing a battery, having a high-voltage tester with a function tester, wherein the function tester has a source and sink for charging and discharging the battery, and wherein the function tester has a data interface and a 12-volt supply for controlling the battery, having a switching device according to the disclosure, which is connected to the source and sink and is provided for switching from the source and sink to the high-voltage tester, having a further switching device according to the disclosure which is connected to the data interface and the 12-volt supply and which is provided for switching from the data interface and the 12-volt supply to the high-voltage tester.

When the present text refers to a test stand for electrical components, it may refer in particular to a battery test stand.

BRIEF DESCRIPTION OF THE DRAWINGS

The disclosure is described in more detail below with reference to drawings illustrating exemplary embodiments. In the schematic figures.

DETAILED DESCRIPTION OF THE DRAWINGS

Figure 1:
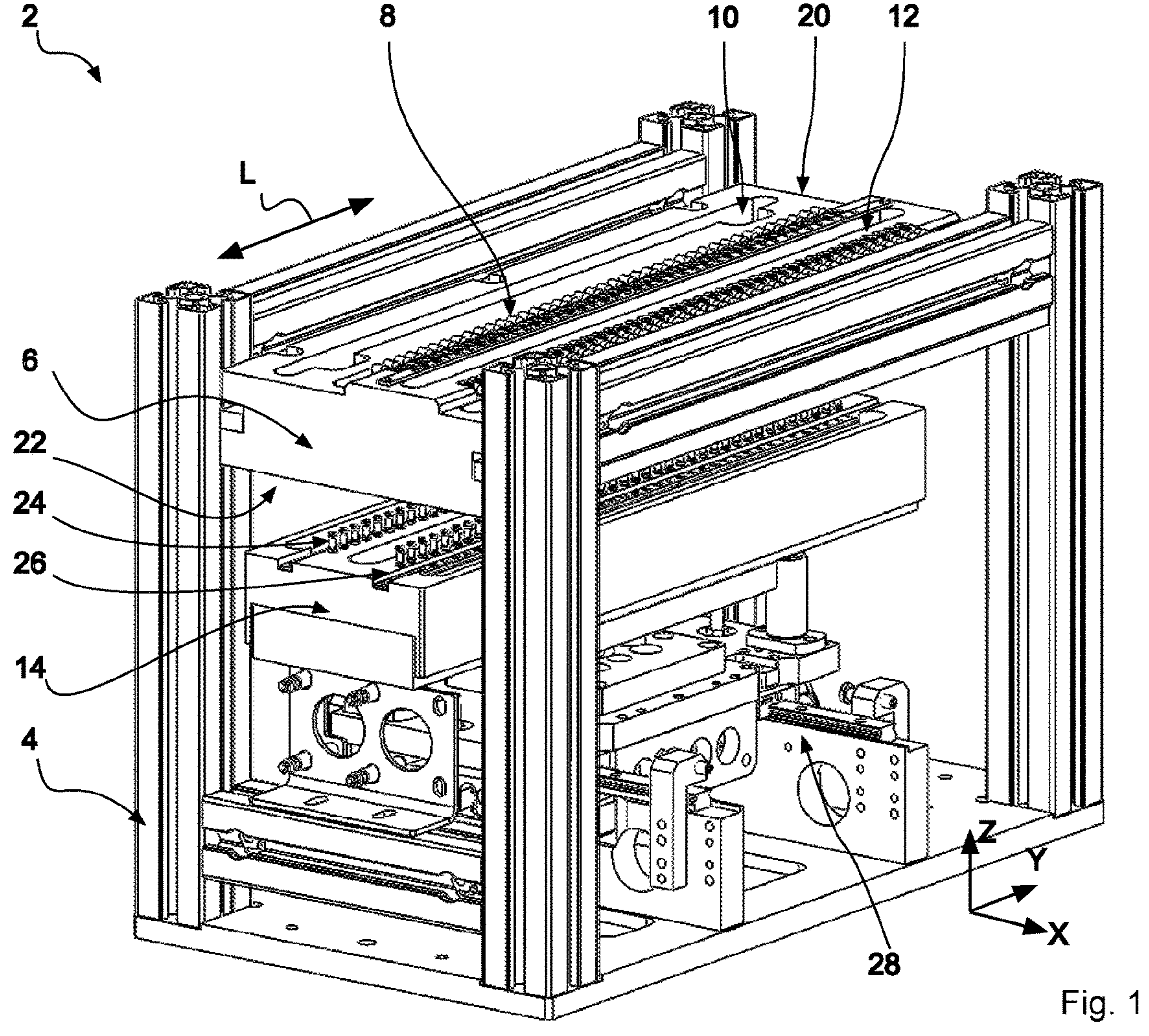
FIG. 1 shows a first switching device according to the disclosure for a test stand for electrical components in a perspective view.

FIG. 1 shows a first switching device 2 according to the disclosure for a test stand for electrical components in a perspective view. For better comprehensibility of the following explanations, a Cartesian coordinate system X-Y-Z is introduced.

The switching device 2 has a support structure 4. In the present case, the support structure 4 is a support structure 4 composed of aluminum profiles. A first contact block 6 is attached to the support structure 4.

The first contact block 6 has first connections 8 for connecting a battery to be tested. In the present example, the first contact block 6 has exactly 40 first connections 8 and exactly 40 third connections 12. The first connections 8 and the third connections 12 are designed for a maximum current of 32 amperes and for a maximum voltage of 10 kV.

The first connections 8 are lined up side by side in a straight line along a longitudinal direction (L). The third connections 12 are lined up in a straight line parallel to the first connections 8 and at a distance from the first connections 8.

In the present case, the first contact block 6 has two second connections 10 for connecting a high-voltage tester, wherein one of the connections 10 is a signal connection and one of the connections 10 is a power connection.

The first contact block 6 has third connections 12 for connecting a function tester. The first contact block 6 is thus used to connect, on the one hand, a battery to be tested and, on the other hand, test equipment such as a high-voltage tester and a function tester to the switching device 2.

Figures 2, 3:
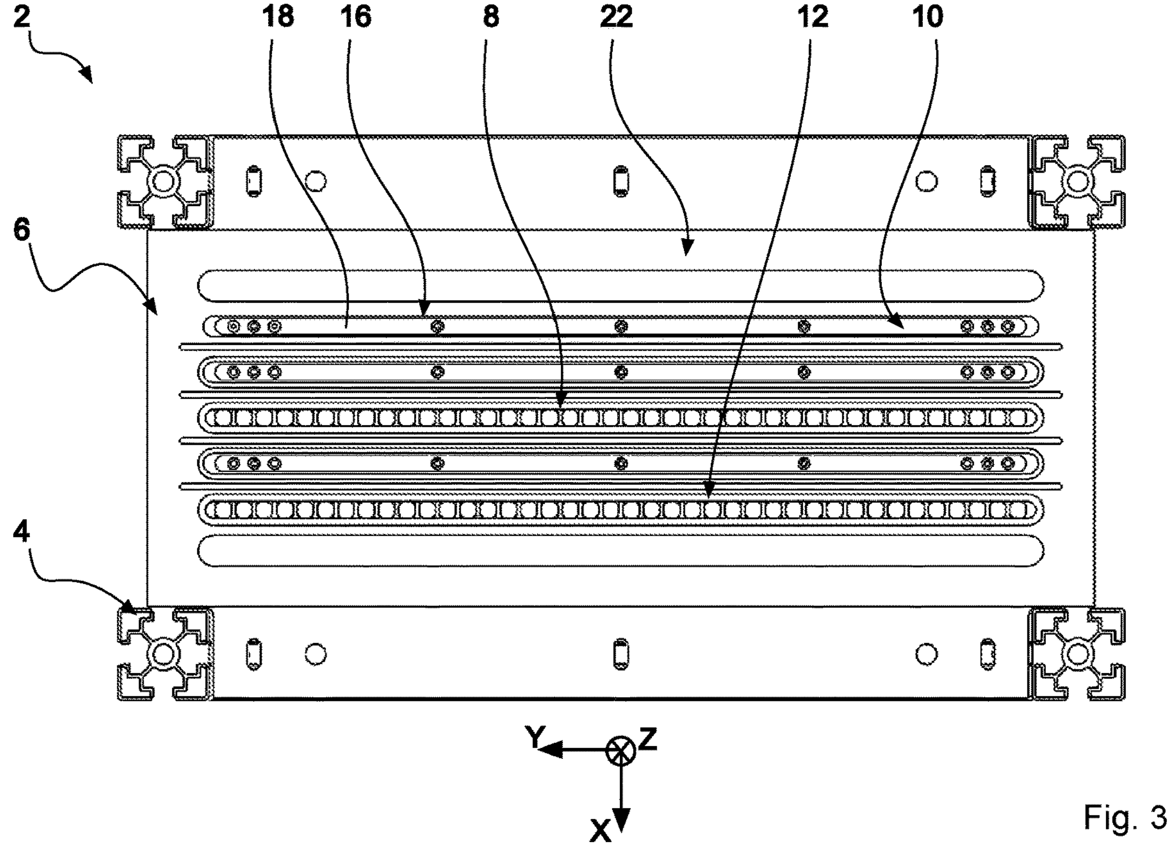
FIG. 2 shows a top view of the switching device shown in FIG. 1.
FIG. 3 shows a first contact block of the switching device of FIG. 1 in a view from below.

FIG. 2 shows the first contact block with its first connections 8, its second connections 10 and its third connections 12 in a top view.

In the present example, the first contact block 6 is held stationary, i.e. immovable, on the support structure 4. Accordingly, the first contact block 6 cannot be moved relative to the support structure 4.

The switching device 2 has a second contact block 14. The second contact block 14 is a contact bridge 14. The second contact block 14 is movable relative to the second contact block 6.

The switching device 2 is used to switch a test stand for electrical components between two different operating modes—namely a power test or functional test and an insulation test.

In a first contact position, the second contact block 14 connects the first connections 8 to the second connections 10. The first contact position is shown in a side view in FIG. 6. In the first contact position, the first connections 8 are bridged by means of a bridge element 16 of the first contact block 6 and connected to the second connections 10 via this bridge element. For this purpose, the bridge element 16 has an electrically conductive strip 18, which in this case is a copper strip.

The strip 18 is arranged at a distance from the first connections 8 and the third connections 12 and is extended parallel to the longitudinal direction L and to the first connections 8 and third connections 12 lined up in a straight line (FIG. 3). The first connections 8 are arranged between the strip 18 and the third connections 12.

Figure 7:
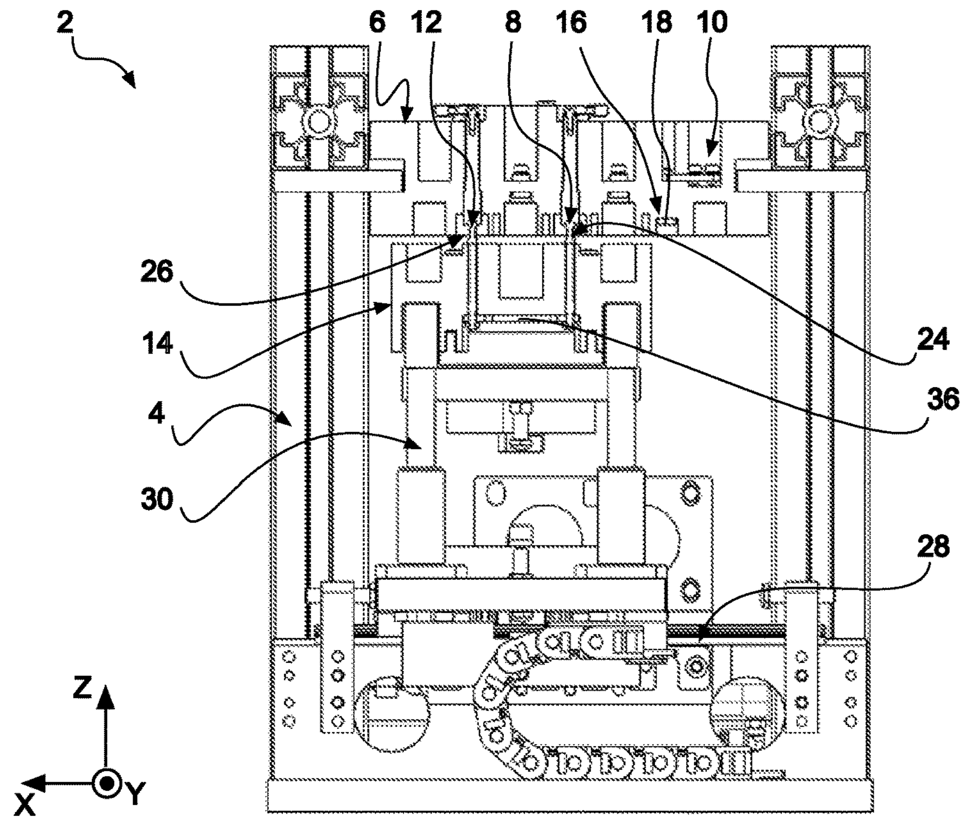
FIG. 7 shows the switching device from FIG. 1 in a side view with the first contact block and the second contact block in a coupled state in a second contact position in a partial section.

In a second contact position, the second contact block 14 connects the first connections 8 to the third connections 12 (FIG. 7).

The first contact block 6 has a connection side 20, in the region of which the first connections 8 can be connected to a wiring harness assigned to a battery to be tested and in the region of which the second connections 12 can be connected to a function tester (FIG. 1).

The first contact block 6 has a changeover side 22 facing away from the connection side 20, in the region of which the first contact block 6 can be connected to the second contact block 14.

Figure 4:
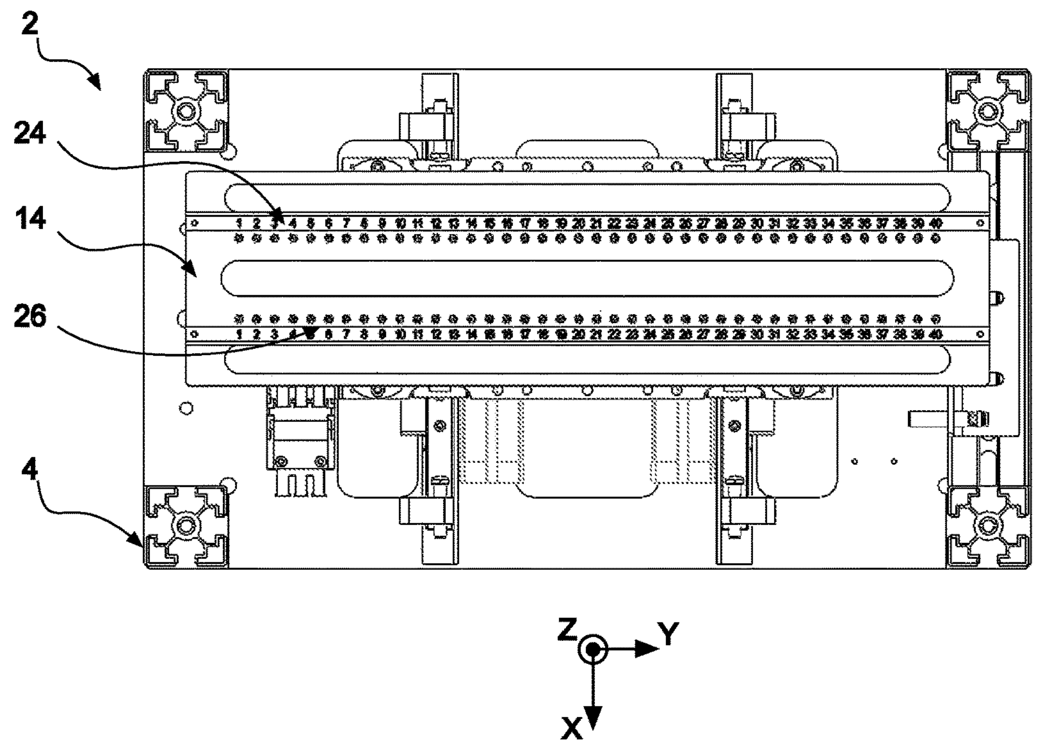
FIG. 4 shows a second contact block of the switching device from FIG. 1 in a top view with the first contact block hidden.

The first connections 8 and the third connections 12 form a first mating face (FIG. 3). Connections 24, 26 of the second contact block 14 form a second mating face matching the first mating face (FIG. 4).

The first connections 8 and the third connections 12 can be simultaneously connected to each other by moving the second contact block 14 to the second contact position by means of the second contact block 14.

Presently, the number of first connections and the number of third connections 12 are identical. The connections 24, 26 of the second contact block 14 have fourth connections 24 and fifth connections 26, the number and arrangement of which correspond to the number and arrangement of the first connections 8 and the third connections 12. The switching device 2 is 40-pole in the present case.

Figure 6:
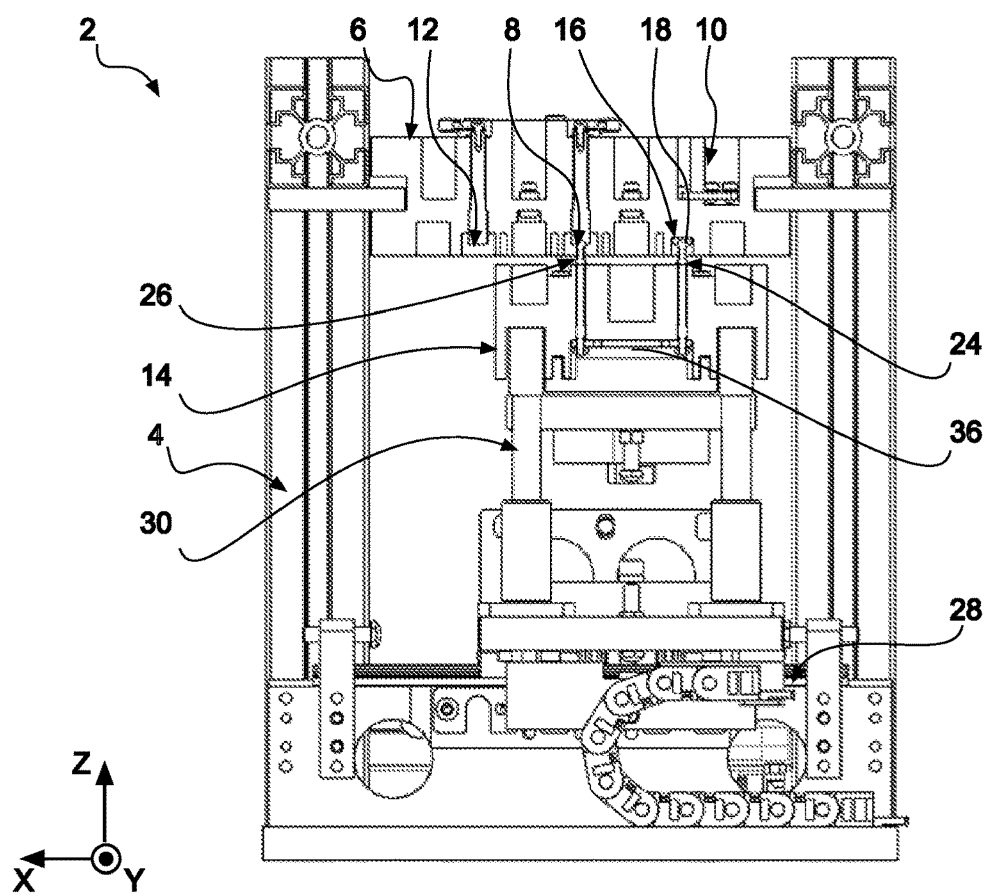
FIG. 6 shows the switching device of FIG. 1 in a side view with the first contact block and the second contact block in a coupled state in a first contact position in a partial section.

As can be seen from FIG. 6 and FIG. 7, the first connections 8, the bridge element 16 and the third connections 12 are arranged at the same height in the Z-direction when viewed along a travel path (Z-direction) of the second contact block 14. When the first contact position or the second contact position is reached, the connections assigned to each other in the respective contact position therefore make contact simultaneously.

The second contact block 14 can be moved automatically.

A first axis 28 is assigned to the second contact block 14 in order to move the second contact block 14 transversely to the first contact block 6 in the X-direction.

A second axis 30 is assigned to the second contact block 14 for moving the second contact block 14 in the Z-direction toward the first contact block 6 to establish a mating connection, and for removing the second contact block 14 from the first contact block 6 to release a mating connection.

The operation of the switching device 2 is described below.

FIGS. 1, 5, 8, 10 show the switching device 2 with the first contact block 6 and the second contact block 14 in the decoupled state. In this decoupled state, the first contact block 6 and the second contact block 14 are spaced apart from each other as viewed in the Z-direction, so that an air gap 32 is formed between the connections 24, 26 of the second contact block 14 and the connections 8, 10, 12 of the first contact block 6.

The entire switching device 2 can be surrounded by a housing 34, the interior I of which is pressurized with a positive pressure or sealing air. In this way, the switching device 2 can be protected from environmental influences such as moisture, dust or dirt. The housing 34 and the interior I are only indicated by way of example in FIG. 5.

Figure 5:
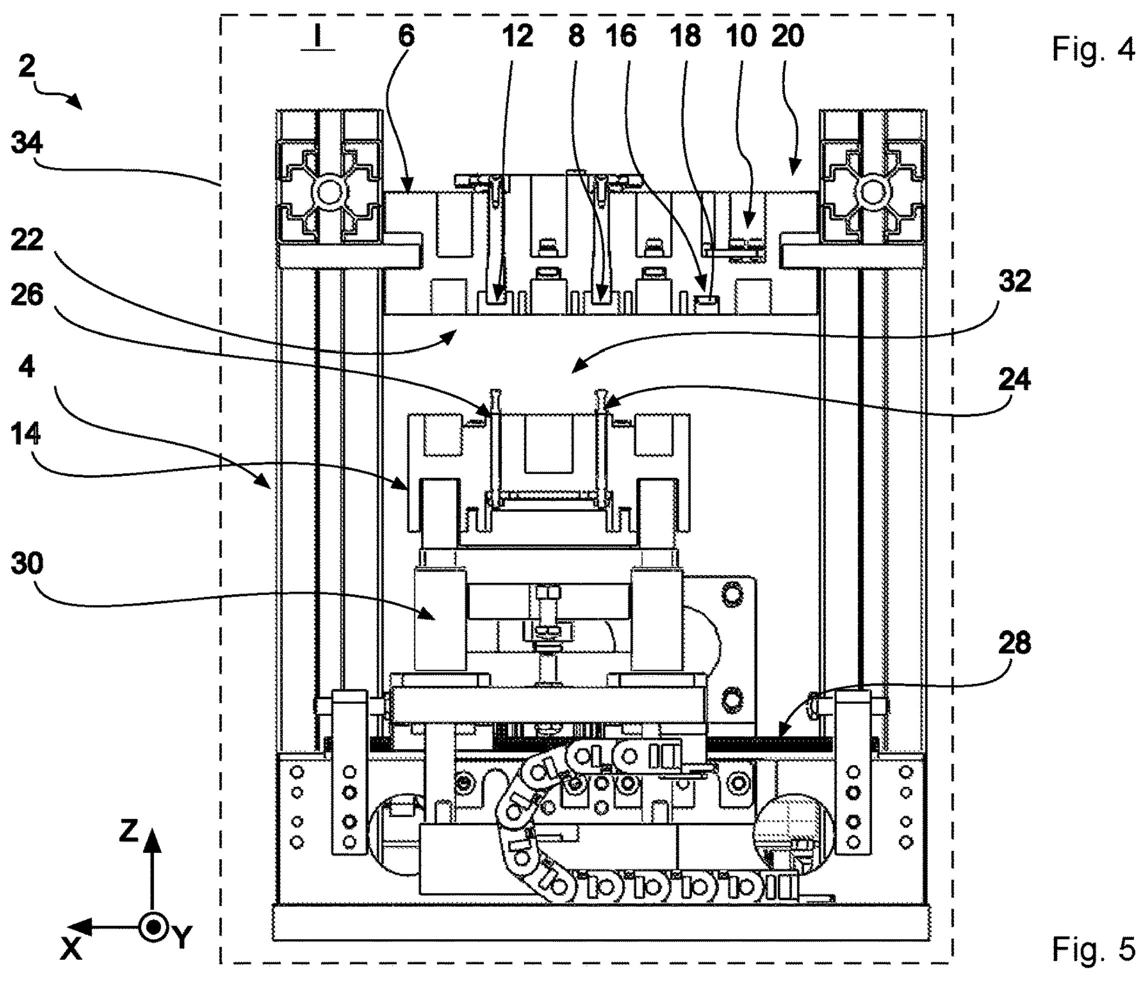
FIG. 5 shows the switching device of FIG. 1 in a side view with the first contact block and the second contact block in a decoupled state in a partial section.

To move the second contact block 14 from the position shown in FIG. 5 to the first contact position shown in FIG. 6, the second contact block 14 is first moved to the right with the first axis 28 linear and parallel to the X-axis according to the arrangement in FIG. 5 until the connections 24, 26 of the second contact block 14 are located exactly below the connections 8 and the strip 18 as viewed in the vertical Z-direction.

Subsequently, by means of the second axis 30, a linear stroke movement is performed in the Z-direction in order to move the second contact block 14 in the direction of the first contact block 6 and to connect the connections 24 in an electrically conductive manner to the strip 18 and, at the same time, to connect the connections 26 to the connections 8.

Each of the respective connections 24 is connected to a respective associated connection 26 of the contact block 14 by means of a respective current bar 36.

Accordingly, in the first contact position shown in FIG. 6, each of the first connections 8 is connected to a respective associated connection 24 via a respective associated connection 26 and its respective associated current bar 36, in which case each of the connections 24 is in contact with the copper strip 18 to bridge all of the connections 8 in this manner.

To release the contacting according to the first contact position, the second contact block 14 is retracted linearly and parallel to the Z-direction by means of the second axis 30 and moved away from the first contact block 6 so that the connections of the first contact block 6 and the connections of the second contact block 14 are no longer engaged with each other and the air gap 32 described above is formed between the connections.

FIG. 7 shows the second contact position. To move the second contact block 14 from the uncoupled position shown in FIG. 5 to the contacted position shown in FIG. 7 according to the second contact position, the second contact block 14 is moved linearly and parallel to the Z-direction by means of the second axis 30 in the direction of the first contact block 6, starting from the position shown in FIG. 5.

In the second contact position shown in FIG. 7, each individual one of the connections 8 is in contact with a respective associated connection 12. For this purpose, each of the connections 8 is electrically conductively connected to a respective associated connection 24, wherein the respective associated connection 24 is connected to a respective associated connection 26 via a respective associated current bar 36, wherein the respective connection 26 is connected again to a respective connection 12. Each of the connections 8 is therefore individually connected to a respective associated connection 12, such that the connections 24, 26 with their associated current bars 36, provide a total of 40 individual bridge connections between the connections 8, 12.

Figure 8:
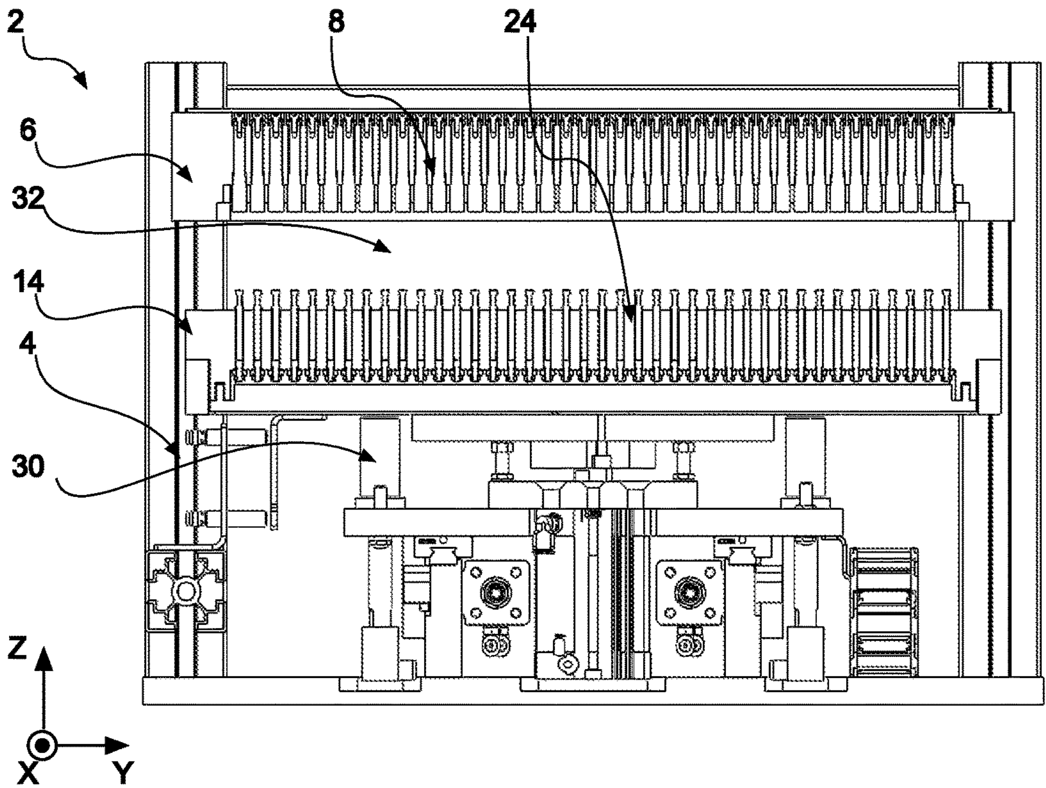
FIG. 8 shows the switching device from FIG. 1 in a further side view with the first contact block and the second contact block in a decoupled state in a partial section.
Figure 9:
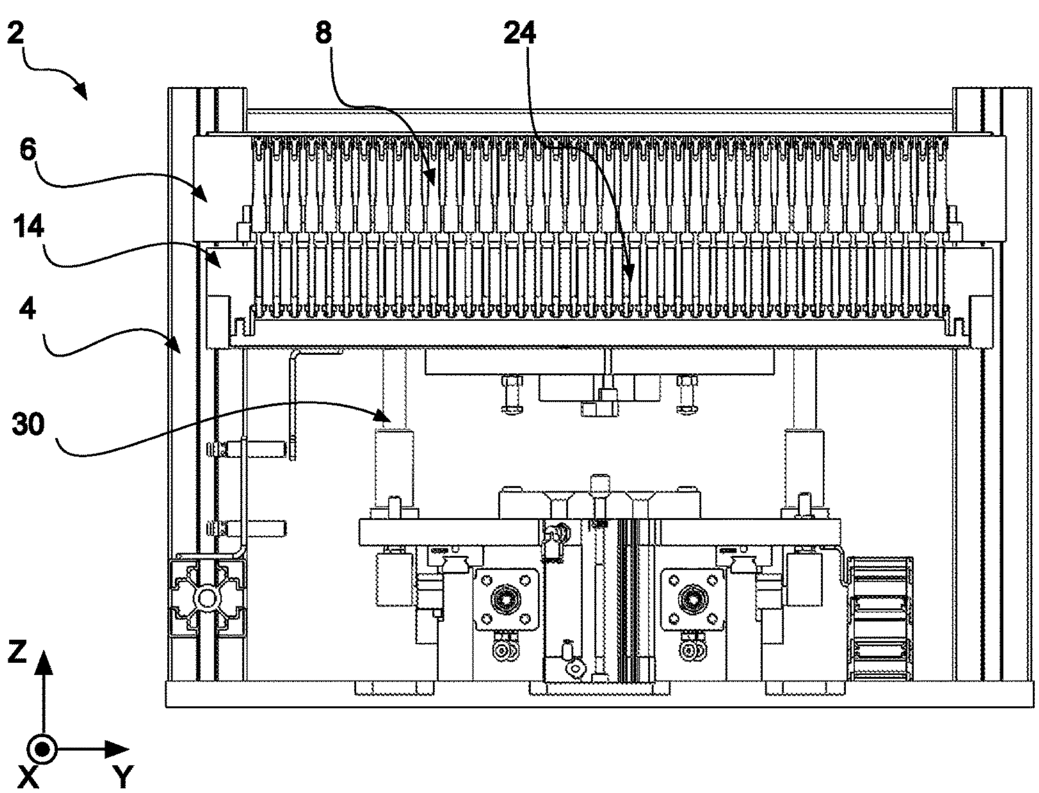
FIG. 9 shows the switching device of FIG. 1 in a further side view with the first contact block and the second contact block in a coupled state in the second contact position in a partial section.

FIG. 8 shows the switching device 2 in a further lateral view before making contact according to the second contact position, wherein FIG. 9 shows the second contact position after performing a stroke movement in Z-direction.

Figure 10:
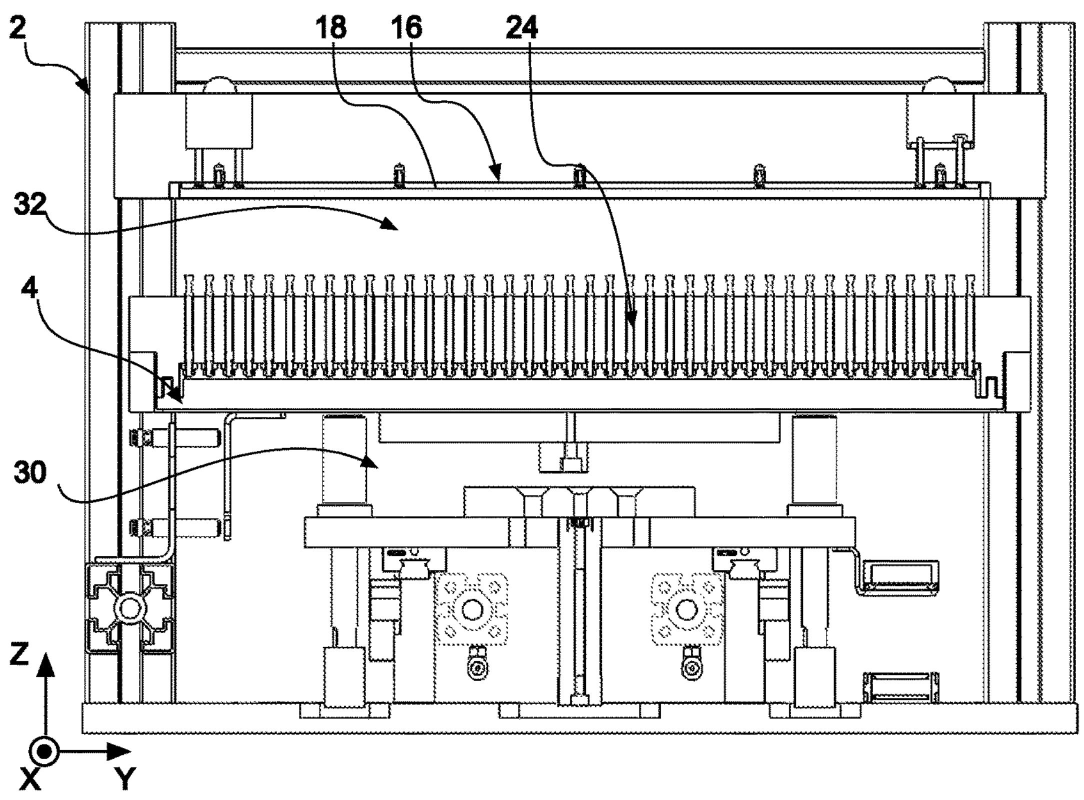
FIG. 10 shows the switching device from FIG. 1 in a further side view with the first contact block and the second contact block in a decoupled state in a partial section.
Figure 11:
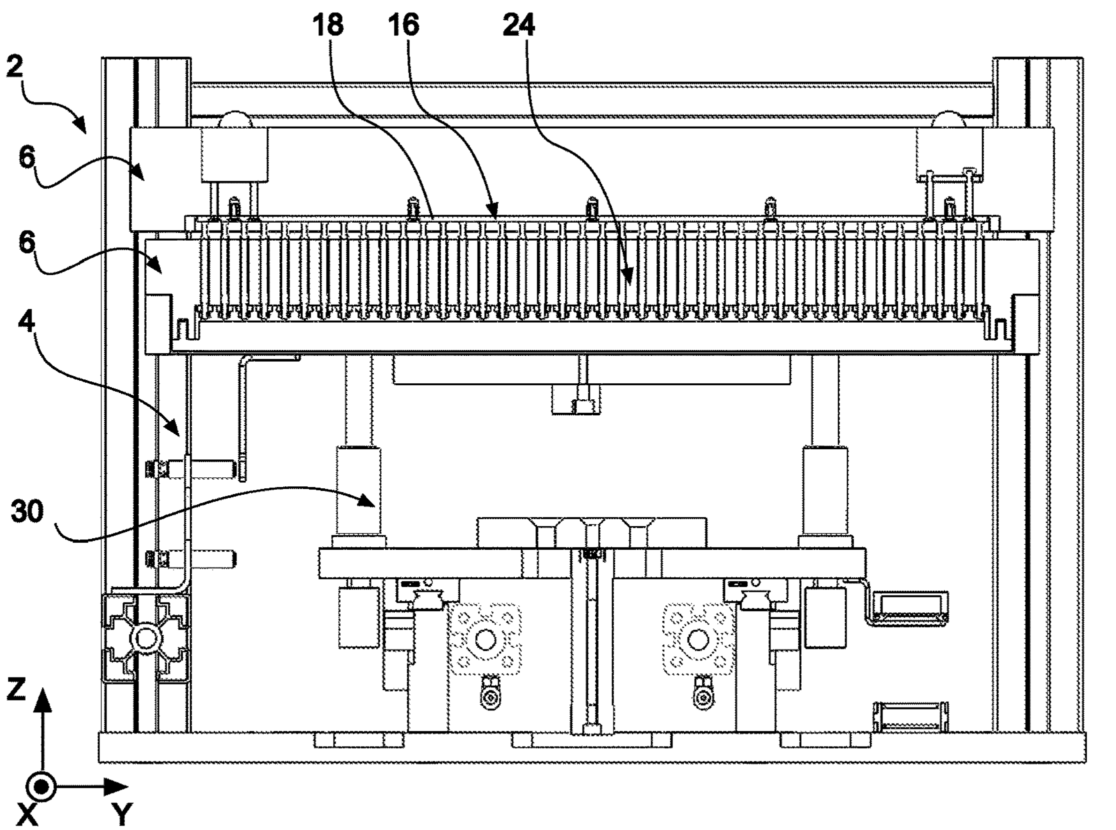
FIG. 11 shows the switching device of FIG. 1 in a further side view with the first contact block and the second contact block in a coupled state in the first contact position in a partial section.

FIG. 10 shows the switching device 2 in the further lateral view before making contact according to the first contact position, wherein FIG. 11 shows the first contact position after performing a stroke movement in Z-direction.

Figure 12:
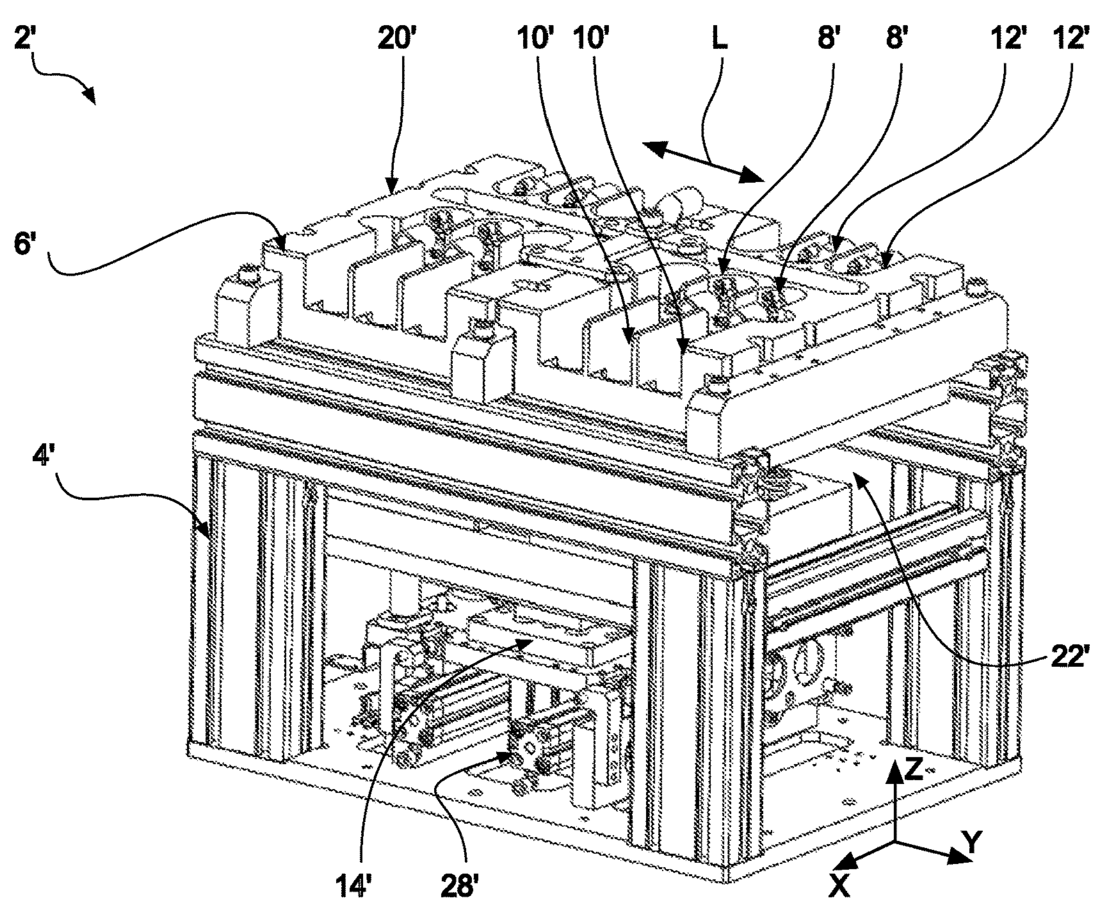
FIG. 12 shows a second switching device according to the disclosure for a test stand for electrical components in a perspective view.
Figure 13:
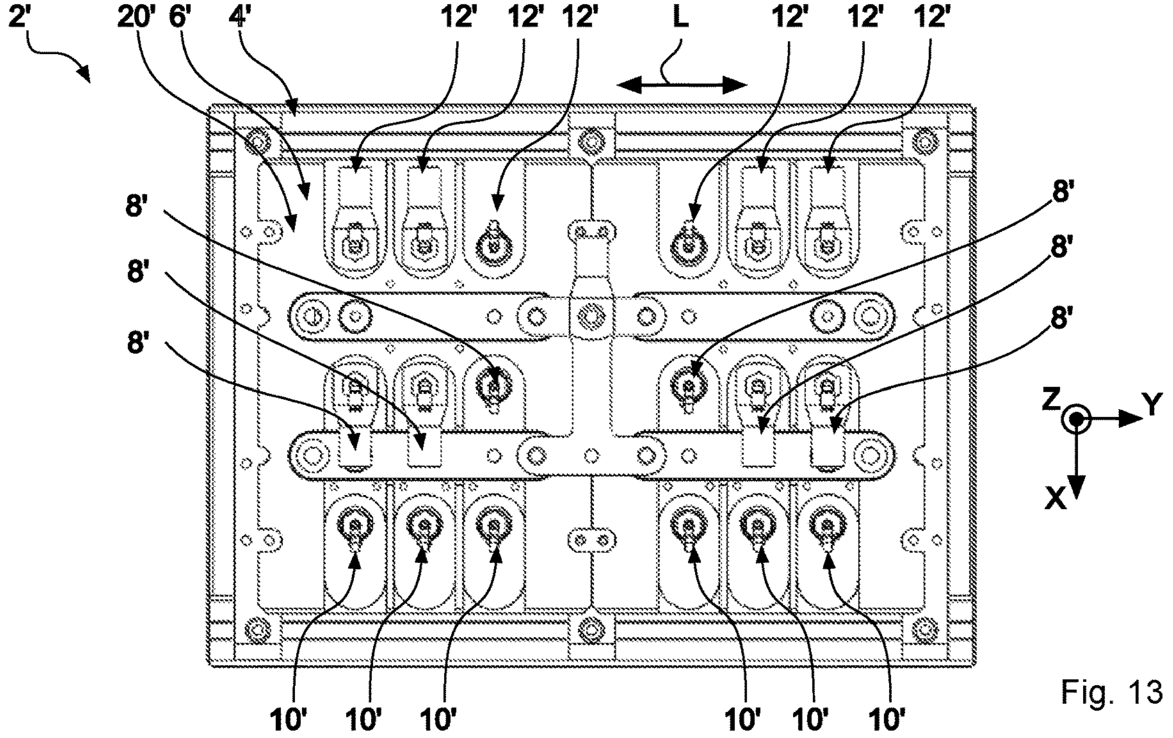
FIG. 13 shows the switching device of FIG. 12 in a top view.

FIG. 12 shows a second switching device 2' according to the disclosure for a test stand for electrical components in a perspective view. For better comprehensibility of the following explanations, a Cartesian coordinate system X-Y-Z is introduced.

The switching device 2' has a support structure 4'. In this case, the support structure 4' is a support structure 4' composed of aluminum profiles. A first contact block 6' is attached to the support structure 4'.

The switching device 2' is 6-pole.

The first contact block 6' has six first connections 8' for connecting a battery to be tested. In the present example, the first contact block 6' has exactly six first connections 8' and exactly six third connections 12'. For the sake of clarity, only two of the respective connections are marked with a reference sign in FIG. 12.

The first connections 8' and the third connections 12' are designed for a maximum current of 600 amperes and for a maximum voltage of 10 kV.

The first connections 8' are lined up next to each other in a straight line along a longitudinal direction (L). The third connections 12' are lined up in a straight line parallel to the first connections 8' and at a distance from the first connections 8'.

The first contact block 6' has six second connections 10' for connecting a high-voltage tester.

The first contact block 6' has third connections 12' for connecting a function tester. The first contact block 6' is thus used to connect, on the one hand, a battery to be tested and, on the other hand, test equipment such as a high-voltage tester and a function tester to the switching device 2'.

FIG. 2 shows the first contact block with its first connections 8', its second connections 10' and its third connections 12' in a top view.

In the present example, the first contact block 6' is held stationary, i.e. immovable, on the support structure 4'. The first contact block 6' is therefore not movable relative to the support structure 4'.

The switching device 2' has a second contact block 14'. The second contact block 14' is a contact bridge 14'. The second contact block 14' is movable relative to the second contact block 6.

The switching device 2' is used to switch a test stand for electrical components between two different operating modes—namely a power test or functional test and an insulation test.

In a first contact position, the second contact block 14' connects the first connections 8' to the second connections 10'. The first contact position is shown in a side view in FIG. 16.

Figure 17:
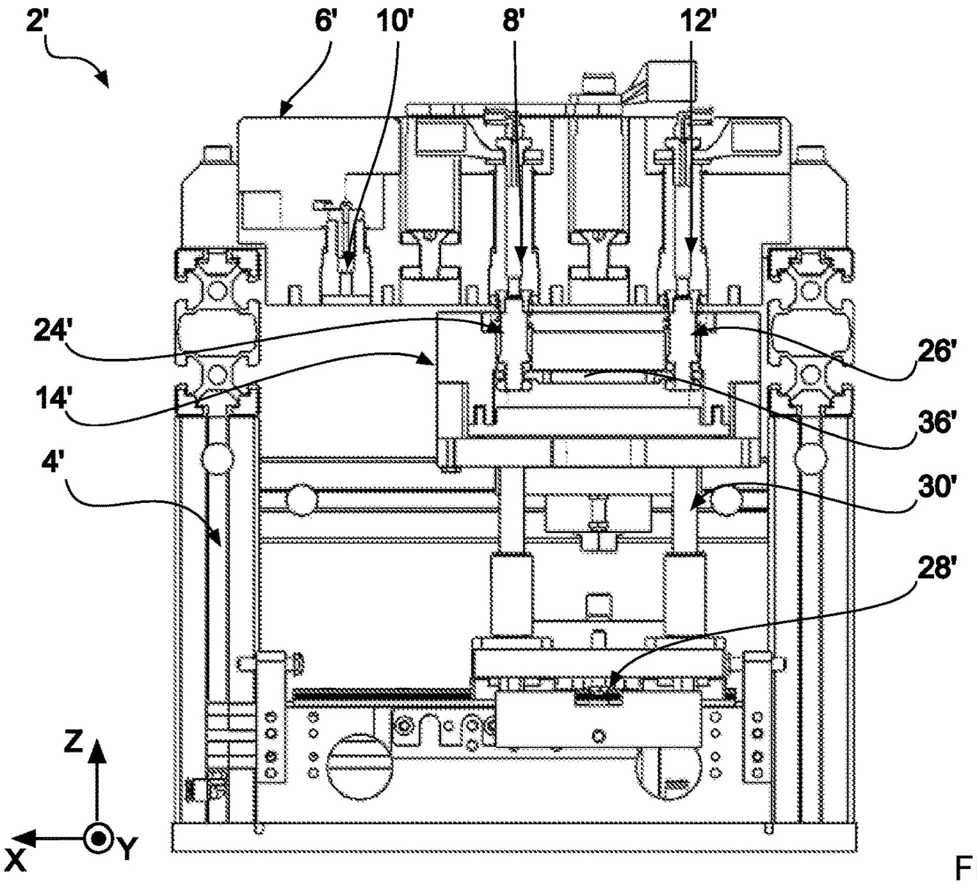
FIG. 17 shows the switching device of FIG. 12 in a side view in a coupled state in a second contact position

In a second contact position, the second contact block 14' connects the first connections 8' to the third connections 12' (FIG. 17).

The first contact block 6' has a connection side 20', in the region of which the first connections 8' can be connected to a wiring harness assigned to a battery to be tested and in the region of which the second connections 12' can be connected to a function tester (FIG. 12).

The first contact block 6' has a changeover side 22' facing away from the connection side 20', in the region of which the first contact block 6' can be connected to the second contact block 14'.

Figure 14:
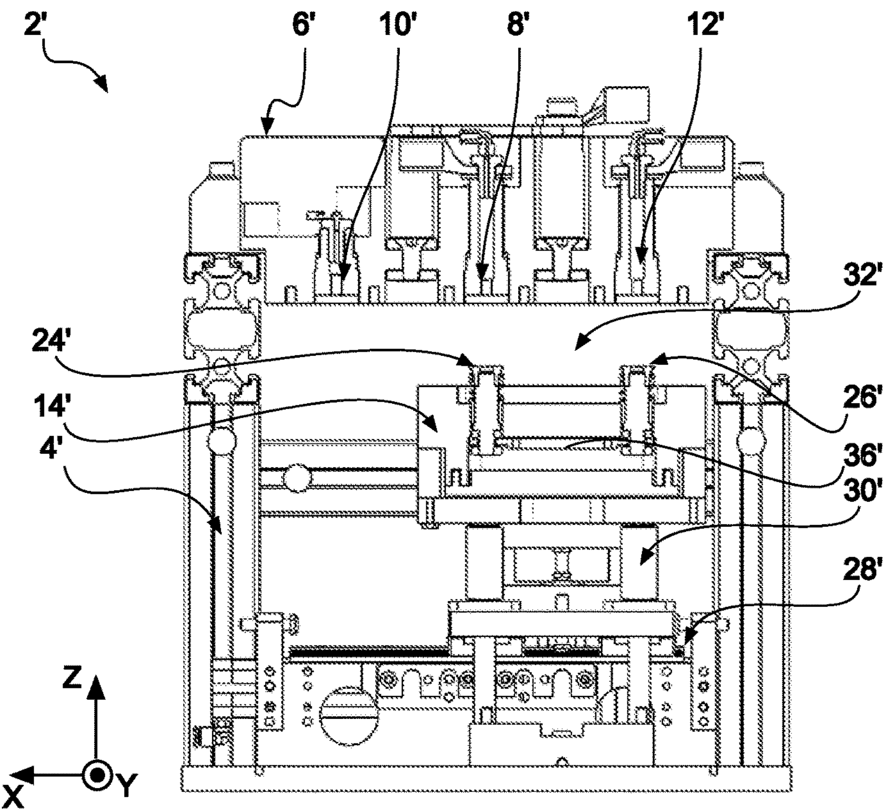
FIG. 14 shows the switching device of FIG. 12 in a side view in a decoupled state in a partial section.

The first connections 8' and the third connections 12' form a first mating face. Connections 24', 26' of the second contact block 14' form a second mating face matching the first mating face (FIG. 14).

The first connections 8' and the third connections 12' can be connected to each other by moving the second contact block 14' into the second contact position simultaneously by means of the second contact block 14'.

Presently, the number of first connections and the number of third connections 12' are identical. The connections 24', 26' of the second contact block 6' have fourth connections 24' and fifth connections 26', the number and arrangement of which correspond to the number and arrangement of the first connections 8', the second connections 10' and the third connections 12'. The switching device 2' is 6-pole in the present case.

Figure 16:
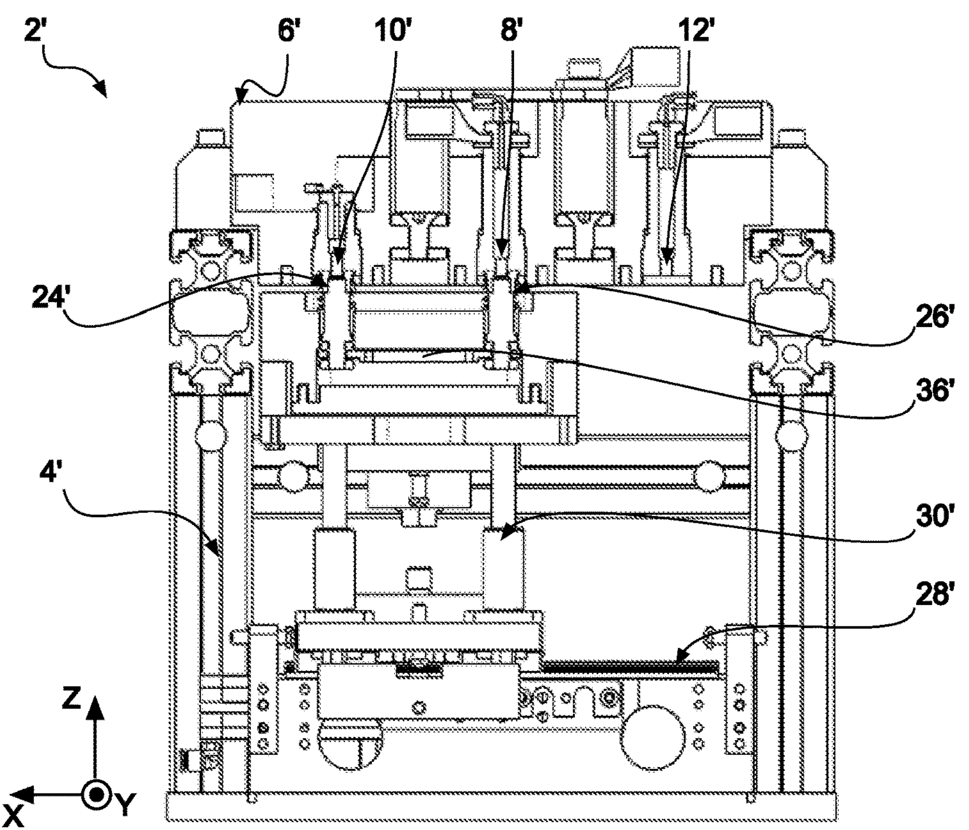
FIG. 16 shows the switching device of FIG. 12 in a side view in a coupled state in a first contact position.

As can be seen from FIG. 16 and FIG. 17, the first connections 8', the second connections 10' and the third connections 12' are arranged at the same height in the Z-direction when viewed along a travel path (Z-direction) of the second contact block 14'. When the first contact position or the second contact position is reached, the connections assigned to each other in the respective contact position therefore make contact simultaneously.

The second contact block 14' can be moved automatically.

A first axis 28' is assigned to the second contact block 14' in order to move the second contact block 14' transversely to the first contact block 6 in the X-direction.

A second axis 30' is assigned to the second contact block 14' for displacing the second contact block 14' in the Z-direction toward the first contact block 6' to establish a plug connection, and for removing the second contact block 14' from the first contact block 6' to release a plug connection.

The operation of the switching device 2' is described below.

Figure 15:
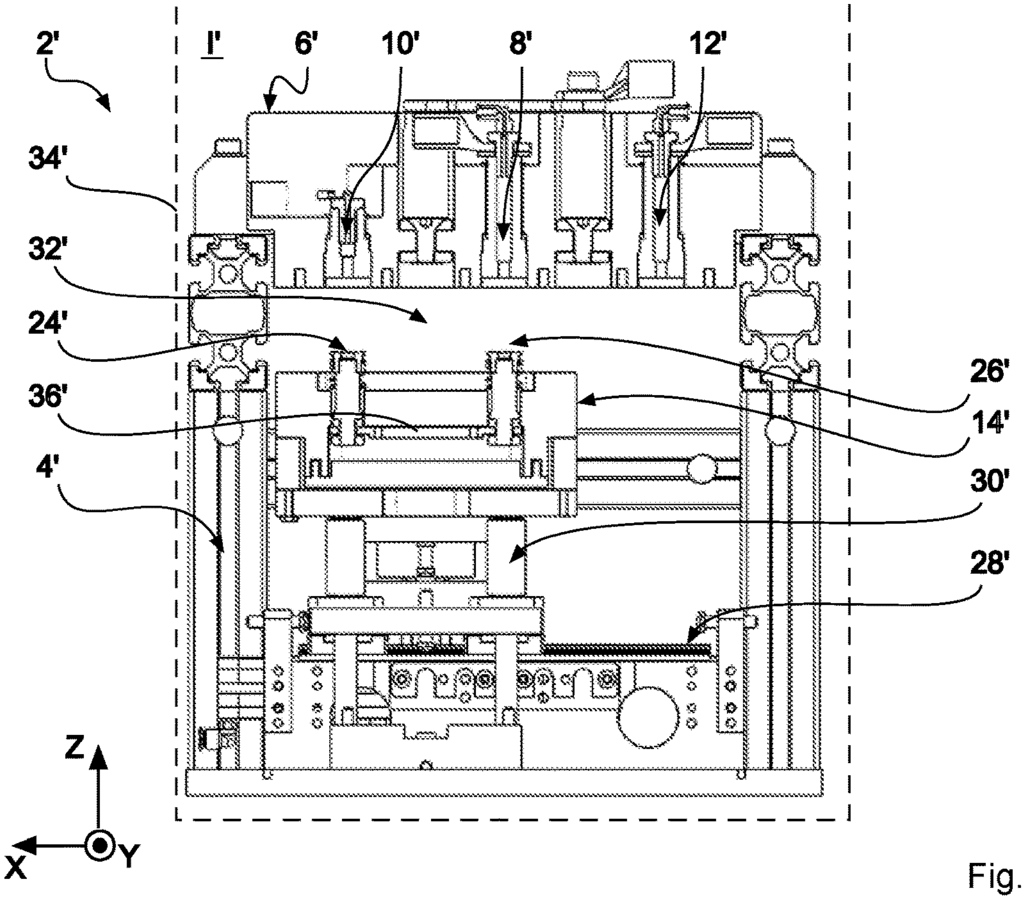
FIG. 15 shows the switching device of FIG. 12 in a side view in a decoupled state in a partial section.

FIGS. 14, 15 show the switching device 2' with the first contact block 6' and the second contact block 14' in the decoupled state. In this decoupled state, the first contact block 6' and the second contact block 14' are spaced apart from one another as viewed in the Z-direction, so that an air gap 32' is formed between the connections 24', 26' of the second contact block 14' and the connections 8', 10', 12' of the first contact block 6'.

The entire switching device 2' can be surrounded by a housing 34', the interior I' of which is pressurized with a positive pressure or sealing air. In this way, the switching device 2' can be protected from environmental influences such as moisture, dust or dirt. The housing 34' and the interior I' are only indicated by way of example in FIG. 15.

In order to move the second contact block 14' from the position shown in FIG. 15 to the first contact position shown in FIG. 16, a linear stroke movement in the Z-direction is performed by means of the second axis 30' in order to displace the second contact block 14' in the direction of the first contact block 6' and to electrically conductively connect the connections 24' to the connections 10' and, at the same time, to connect the connections 26' to the connections 8'.

Each of the respective connections 24' is connected to a respective associated connection 26' of the contact block 14 by means of a respective current bar 36'.

Accordingly, in the first contact position shown in FIG. 16, each of the first connections 8' is connected to a respective associated connection 24' via a respective associated connection 26' and its respective associated current bar 36', in which case each of the connections 24' is connected to a respective connection 10'.

To release the contacting according to the first contact position, the second contact block 14' is retracted linearly and parallel to the Z-direction by means of the second axis 30' and moved away from the first contact block 6' so that the connections of the first contact block 6' and the connections of the second contact block 14' are no longer engaged with each other and the air gap 32' described above is formed between the connections.

FIG. 17 shows the second contact position.

In order to move the second contact block 14 from the uncoupled position shown in FIG. 14 to the contacted position shown in FIG. 17 according to the second contact position, the second contact block 14' is moved linearly and parallel to the Z-direction by means of the second axis 30' in the direction of the first contact block 6, starting from the position shown in FIG. 14. The contact position can be moved in the X-direction between the positions shown in FIG. 14 and FIG. 15 by means of the first axis 28'.

In the second contact position shown in FIG. 17, each individual one of the connections 8' is in contact with a respective associated connection 12'. For this purpose, each of the connections 8' is electrically conductively connected to a respective associated connection 24', wherein the respective associated connection 24' is connected to a respective associated connection 26' via a respective associated current bar 36', wherein the respective connection 26' is again connected to a respective connection 12'. Each of the connections 8' is therefore individually connected to a respective associated connection 12', so that the connections 24', 26' with their associated current bars 36', establish a total of six individual bridge connections between the connections 8', 12'.

Figure 18:
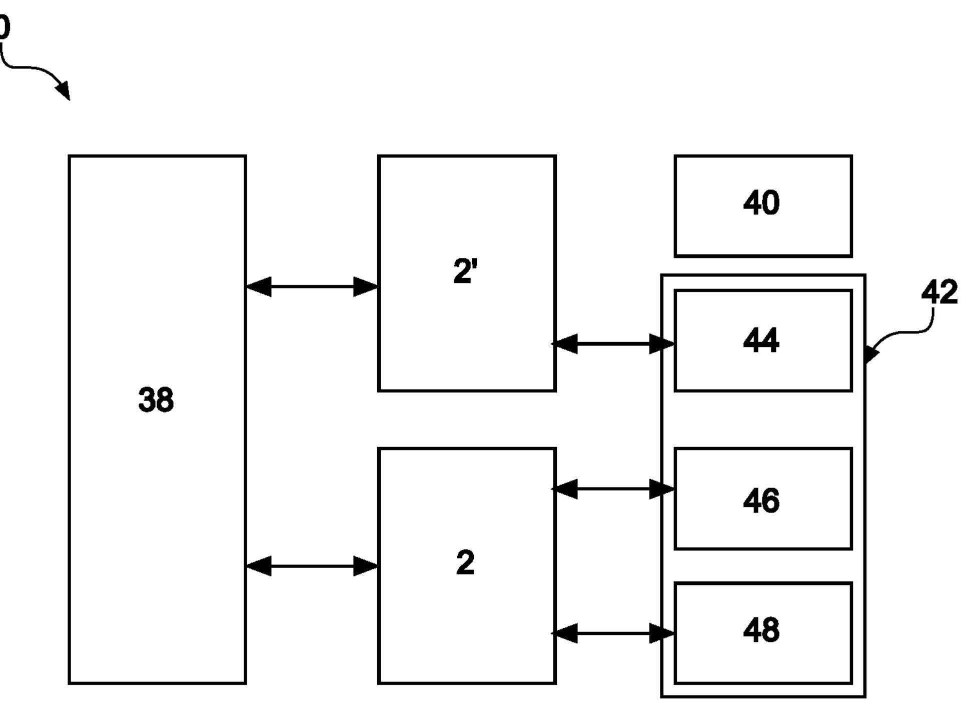
FIG. 18 shows a test stand for electrical components according to the disclosure with the switching devices in the second contact position.
Figure 19:
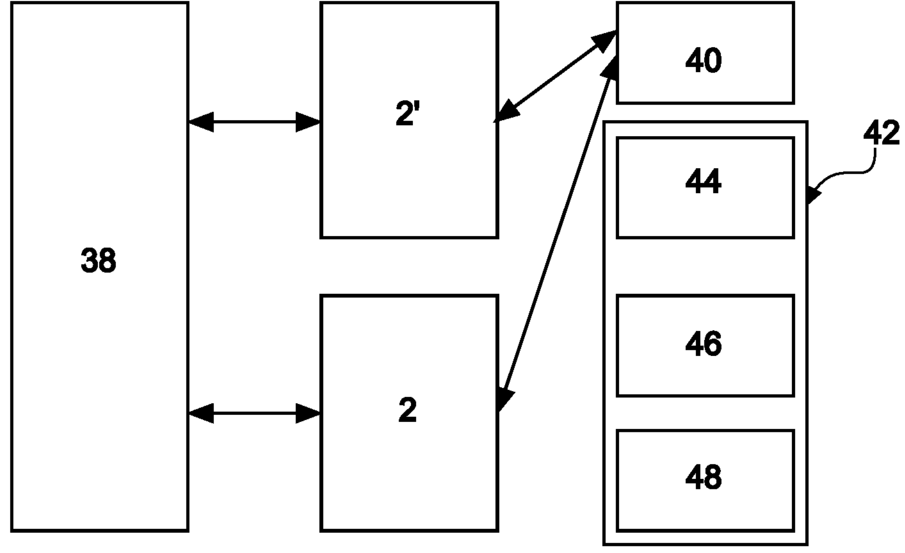
FIG. 19 shows a test stand for electrical components according to the disclosure with the switching devices in the first contact position.

FIG. 18 and FIG. 19 schematically show a test stand for electrical components 50 for testing a battery 38. The battery 38 is a traction battery for a motor vehicle.

The test stand for electrical components 50 has a high-voltage tester 40.

The test stand for electrical components 50 has a one function tester 42, wherein the function tester 42 includes a source/sink 44 for charging and discharging the battery 38, and wherein the function tester 42 includes a data interface 46 and a 12-volt supply 48 for controlling the battery 38.

The test stand for electrical components 50 has a switching device 2', described above, connected to the source/sink 44 and provided for switching from the source/sink 44 to the high-voltage tester 40.

The test stand for electrical components 50 has a switching device 2, described above, which is connected to the data interface 46 and the 12-volt supply 48 and which is provided for switching from the data interface 46 and the 12-volt supply 48 to the high-voltage tester 40.

The high-voltage tester 40 is set up to provide a voltage of up to 10 kilovolts at a few milliamperes.

The source/sink is designed for a charge/discharge capacity of 10-300 kilowatts.

According to FIG. 18, the switching devices 2, 2' are in the second contact position. The test stand for electrical components 50 is operated in the "function test" or "power test" operating mode, with the battery 38 connected to the function tester 42 and its components 44, 46, 48.

According to FIG. 19, the switching devices 2, 2' are in the first contact position. The test stand for electrical components 50 is operated in the "insulation test" operating mode, with the battery 38 connected to the high-voltage tester 40.

The test stand for electrical components 50 can therefore be switched between the two operating modes "functional test" and "insulation test" by means of the switching devices 2, 2'.

The invention claimed is:

1. A switching device for a test stand for electrical components, the switching device comprising:

a support structure, a first contact block attached to the support structure, wherein the first contact block has first connections for connecting a battery to be tested, wherein the first contact block has one or more second connections for connecting a high-voltage tester, and wherein the first contact block has third connections for connecting a function tester, a second contact block, wherein the second contact block is a contact bridge, wherein the second contact block is movable relative to the first contact block, wherein the second contact block, in a first contact position, connects the first connections to at least one second connection, wherein the first connections are bridged in the first contact position by means of a bridge element of the first contact block and are connected to the at least one second connection via the bridge element or, in a first contact position, connects the first connections to the second connections, wherein the second contact block, in a second contact position, connects the first connections to the third connections.

2. The switching device according to claim 1, further comprising:

twenty or more first connections and twenty or more third connections, and/or one hundred or fewer first connections and one hundred or fewer third connections, and/or exactly forty first connections and exactly forty third connections.

3. The switching device according to claim 2, wherein the first connections and the third connections are designed for a current of maximum 32 amperes and/or for a voltage of maximum 10 kV.

4. The switching device according to claim 1, further comprising:

two or more first connections and two or more third connections, and/or ten or fewer first connections and ten or fewer third connections, and/or exactly three first connections and exactly three third connections, and/or exactly six first connections and exactly six third connections provided.

5. The switching device according to claim 4, wherein the first connections and the third connections are designed for a current of at most 1000 amperes, and/or for a voltage of at most 10 kilovolts.

6. The switching device according to claim 1, wherein the first connections are lined up side by side in a straight line along a longitudinal direction, and the third connections are lined up side by side in a straight line parallel to the first connections and at a distance from the first connections.

7. The switching device according to claim 1, wherein the bridge element has an electrically conductive strip.

8. The switching device according to claim 6, wherein the strip is arranged at a distance from the first connections and the third connections and is extended parallel to the longitudinal direction and to the first and third connections which are lined up in a straight line and/or the first connections are arranged between the strip and the third connections.

9. The switching device according to claim 1, wherein the first contact block has a connection side in the region of which the first connections are connected to a wiring harness assigned to a battery to be tested and in the region of which the second connections are connected to a function tester, and in that the first contact block has a changeover side facing away from the connection side, in the region of which the first contact block are connected to the second contact block.

10. The switching device according to claim 1, wherein the first connections and the third connections form a first mating face, and in that connections of the second contact block form a second mating face matching the first mating face, so that the first connections and the third connections are connected to each other simultaneously by means of the second contact block by moving the second contact block into the second contact position.

11. The switching device according to claim 1, wherein the number of first connections and the number of third connections are identical.

12. The switching device of claim 10, wherein connections of the second contact block have fourth connections and fifth connections, whose number and arrangement correspond to the number and arrangement of the first connections and the third connections.

13. The switching device according to claim 1, wherein the first connections, the bridge element and the third connections are arranged at the same height as viewed along a travel path of the second contact block.

14. The switching device according to claim 1, wherein the second contact block are moved automatically.

15. The switching device according to claim 14, wherein a first axis is assigned to the second contact block to displace the second contact block transversely to the first contact block, and a second axis is assigned to the second contact block (14, 14") to remove the second contact block from the first contact block to make a mating connection in the direction of the first contact block and to release a plug connection from the first contact block.

16. The switching device for a test stand for electrical components according to claim 1, having a support structure, having a first contact block attached to the support structure, wherein the first contact block has first connections for connecting a battery to be tested, wherein the first contact block comprises one or more second connections for connecting a high-voltage tester, and wherein the first contact block has third connections for connecting a function tester, having a second contact block, wherein the second contact block is a contact bridge wherein the second contact block is movable relative to the first contact block, wherein the second contact block, in a first contact position, connects the first connections to at least one second connection, wherein the first connections are bridged in the first contact position by means of a bridge element of the first contact block and are connected to the at least one second connection via the bridge element, wherein the second contact block, in a second contact position, connects the first connections to the third connections.

17. The switching device for a test stand for electrical components, according to claim 1, having a support structure, having a first contact block attached to the support structure, wherein the first contact block has first connections for connecting a battery to be tested, wherein the first contact block comprises one or more second connections for connecting a high-voltage tester, and wherein the first contact block has third connections for connecting a function tester, having a second contact block, wherein the second contact block is a contact bridge wherein the second contact block is movable relative to the first contact block, wherein the second contact block, in a first contact position, connects the first connections to the second connections, wherein the second contact block, in a second contact position, connects the first connections to the third connections.

18. A test stand for electrical components for testing a battery, comprising a high-voltage tester, a function tester, and wherein the function tester has a source and/or sink for charging and/or discharging the battery and/or wherein the function tester has a data interface and/or a 12-volt supply for controlling the battery, having a switching device according to claim 1.

19. The test stand for electrical components for testing a battery, comprising:

a high-voltage tester, a function tester, wherein the function tester has a source and sink for charging and discharging the battery, and wherein the function tester includes a data interface and a 12-volt supply for controlling the battery, and a first switching device according to claim 1, which is connected to the source and sink and is provided for switching from the source and sink to the high-voltage tester, having a second switching device, which is connected to the data interface and the 12-volt supply and is provided for switching from the data interface and the 12-volt supply to the high-voltage tester.

* * * * *